(12) United States Patent
Morin

(10) Patent No.: US 9,000,498 B2
(45) Date of Patent: Apr. 7, 2015

(54) FINFET WITH MULTIPLE CONCENTRATION PERCENTAGES

(71) Applicant: STMicroelectronics, Inc., Coppell, TX (US)

(72) Inventor: Pierre Morin, Albany, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 13/931,581

(22) Filed: Jun. 28, 2013

(65) Prior Publication Data

US 2015/0001595 A1 Jan. 1, 2015

(51) Int. Cl.
*H01L 29/78* (2006.01)
*H01L 21/02* (2006.01)
*H01L 29/66* (2006.01)

(52) U.S. Cl.
CPC ...... *H01L 29/7849* (2013.01); *H01L 21/02381* (2013.01); *H01L 21/02587* (2013.01); *H01L 29/66795* (2013.01); *H01L 29/785* (2013.01)

(58) Field of Classification Search
CPC ............ H01L 29/66795; H01L 21/845; H01L 27/1211; H01L 21/823431; H01L 27/10879; H01L 21/823821
See application file for complete search history.

(56) References Cited

U.S. PATENT DOCUMENTS

| | | | | |
|---|---|---|---|---|
| 6,800,910 | B2 * | 10/2004 | Lin et al. | 257/410 |
| 6,972,461 | B1 * | 12/2005 | Chen et al. | 257/347 |
| 7,393,768 | B2 * | 7/2008 | Degroote | 438/585 |
| 7,687,859 | B2 * | 3/2010 | Russ et al. | 257/357 |
| 7,781,315 | B2 * | 8/2010 | Lenoble | 438/514 |
| 8,169,025 | B2 * | 5/2012 | Bedell et al. | 257/351 |
| 8,247,275 | B2 * | 8/2012 | Hoentschel et al. | 438/150 |
| 8,470,689 | B2 * | 6/2013 | Desplobain et al. | 438/458 |
| 2005/0077553 | A1 * | 4/2005 | Kim et al. | 257/288 |
| 2006/0006466 | A1 * | 1/2006 | Iinuma | 257/347 |
| 2006/0073647 | A1 * | 4/2006 | Inaba | 438/157 |
| 2008/0006908 | A1 * | 1/2008 | Lin et al. | 257/619 |
| 2008/0029821 | A1 * | 2/2008 | Yamagami et al. | 257/365 |
| 2008/0099850 | A1 * | 5/2008 | Jeon et al. | 257/365 |
| 2008/0191271 | A1 * | 8/2008 | Yagishita et al. | 257/327 |
| 2009/0020786 | A1 * | 1/2009 | Lenoble et al. | 257/213 |
| 2011/0284967 | A1 * | 11/2011 | Cheng et al. | 257/368 |
| 2012/0091528 | A1 * | 4/2012 | Chang et al. | 257/347 |
| 2012/0104472 | A1 * | 5/2012 | Xu et al. | 257/288 |
| 2013/0052801 | A1 * | 2/2013 | Berliner et al. | 438/468 |

OTHER PUBLICATIONS

Eneman et al., "Stress Techniques in Advacned Transistor Architectures: Bulk FinFETs and Implant-Free Quantum Well Transistors" 2012, The Electrochemical Society, ECS Transactions 45. p. 6.*

* cited by examiner

*Primary Examiner* — Evan Pert
*Assistant Examiner* — Gustavo Ramallo
(74) *Attorney, Agent, or Firm* — Seed IP Law Group PLLC

(57) ABSTRACT

An apparatus of a semiconductor is provided wherein the apparatus comprises a substrate, a stack, and a fin. The substrate supports the stack and the substrate comprises a first material. The stack provides for the fin and the stack comprises: a strain induced in the stack via the substrate; the first material and a second material; and a plurality of concentrations of the second material with respect to the first material. The fin provides a source and a drain of a field effect transistor.

21 Claims, 10 Drawing Sheets

US 9,000,498 B2

FINFET WITH MULTIPLE CONCENTRATION PERCENTAGES

TECHNICAL FIELD

The present application relates generally to field effect transistors (FETs), more specifically, to fin FETs (FinFETs).

BACKGROUND

MOSFETs are used for amplifying or switching electronic signals. A MOSFET can comprise three or four terminals one each for a gate (G), a source (S), a drain (D), and a body (B), wherein the body may be short circuited to the source.

Fin Field Effect Transistors (FinFETs) are MOSFETs that are constructed with a fin. The source and drain of the FET sit as a fin on top of an insulator layer. Construction of a transistor in this manner presents several opportunities and drawbacks.

SUMMARY

An apparatus of a semiconductor is provided wherein the apparatus comprises a substrate, a stack, and a fin. The substrate supports the stack and the substrate comprises a first material. The stack provides for the fin and the stack comprises: a strain induced in the stack via the substrate; the first material and a second material; and a plurality of concentrations of the second material with respect to the first material. The fin provides a source and a drain of a field effect transistor.

A method of a semiconductor apparatus is provided. The method comprises supporting, via a substrate, a stack, the substrate comprising a first material. The method further comprises providing, via the stack, a fin, a strain induced in the stack via the substrate, and the stack comprising the first material and a second material. The method further comprises providing, via the fin, a source and a drain of a field effect transistor, the fin formed from the stack by etching away one or more portions of the stack, a relaxation in the strain of the stack of the fin via the etching, the stack of the fin comprising a plurality of concentrations of the second material with respect to the first material, and the plurality of concentrations to compensate for the relaxation.

A fin field effect transistor (FinFET) is provided, the FinFET comprising a substrate, a stack and a fin. The substrate supports the stack and the substrate comprises a first material. The stack provides for the fin and the stack comprises: a strain induced in the stack via the substrate; the first material and a second material; and a plurality of concentrations of the second material with respect to the first material. The fin provides a source and a drain of the field effect transistor.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged cellular system.

Figure 1:
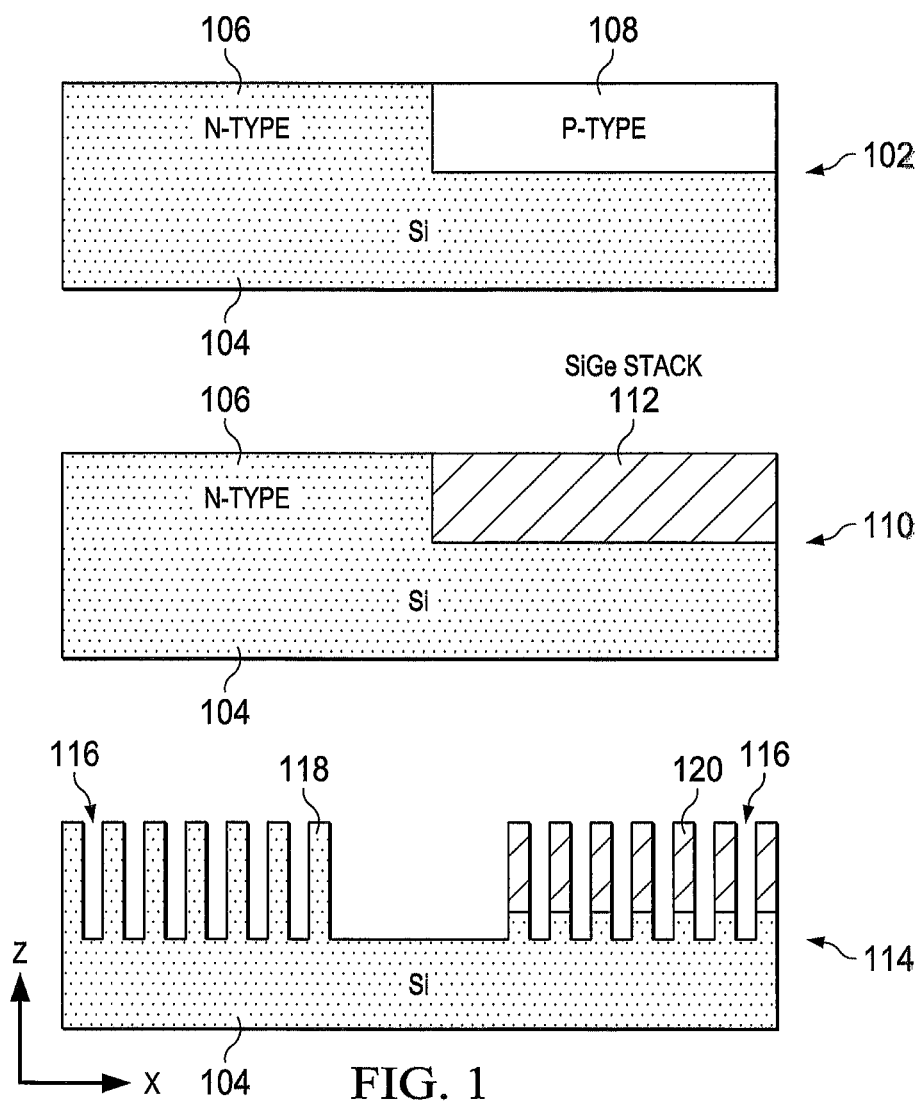
FIG. 1 illustrates construction of fins for FinFETs according to embodiments of the present disclosure.

FIG. 1 illustrates construction of FinFETs according to embodiments of the present disclosure. Device 102 includes substrate 104, n-type portion 106, and p-type portion 108. Substrate 104 may be made of any suitable material, including silicon, and the like. N-type portion 106 can comprise the same material as substrate 104. Substrate 104, n-type portion 106, and p-type portion 108 may initially be of a homogeneous material wherein portion 108 is removed in order to create a p-type FinFET. Alternatively, the n-type portion 106 can be grown on top of substrate 104.

Device 110, which is similar to device 102, includes a silicon germanium (SiGe) stack 112 is deposited as a strained layer on top of p-type portion 108. Stack 112 comprises multiple concentrations of silicon and germanium such that the ratio of silicon to germanium throughout Stack 112 is not uniform. Stress on Stack 112 caused by the interface of Stack 112 with substrate 104 is a compressive biaxial stress and is based at least in part on germanium content until a critical height above substrate 104 is achieved.

Stack 112 can also comprise additional materials with respective gradients to affect performance. For example, tin may be added to form a SiGeSn alloy to affect performance.

Device 114, which is similar to device 110, has multiple portions 116 etched so as to form multiple p-type fins 118, and multiple n-type fins 120. SiGe within the p-type fins 120 is used as channel material for p-type CMOS transistors so as to provide for tuning a transistor to an input voltage ($V_t$), enhance mobility of holes via germanium content, and provide a compressed strained channel to also affect the mobility of the holes through the channel material.

Etching away portions 116 creates a relaxation in a stress on Stack 112 and causes the biaxial compressive stress to become a uniaxial compressive stress along a length or longitudinal axis of a fin. The relaxation is compensated for at least in part by using multiple concentrations of germanium within Stack 112. The multiple concentrations of germanium within Stack 112 may be formed as a gradient such that lower layers have less percentage germanium content as compared to higher layers, or vice versa.

Certain embodiments, where the gradient is such that higher layers have less percentage germanium content as compared to lower layers, have stress induced that is higher on a bottom of the fin as compared to a top of the fin. This gradient, which may be referred to as an inverse gradient, can used to get a homogenous stress or a stress with a gradient from the top to the bottom of the fin.

Certain embodiments, where multiple periodic elements are used, can have concentrations and gradients for each periodic element to affect performance. For example, when a SiGeSn alloy is used, concentrations of silicon, germanium, and tin can be independent, dependent, or covariant, with respect to each of the periodic elements used.

Multiple concentrations of germanium percentage can be achieved by recipe adaptation such as germanium precursor flow. Additionally, pressure can also be used to optimize uniformity of thickness of the multiple concentrations of germanium.

In certain embodiments, concentration of germanium may be formed as a soft gradient from a bottom of the fin to a top of the fin. In certain embodiments, concentration of germanium may be formed via discrete increases in concentration percentage for one or more layers of the fin. With one or more layers, thickness of each layer can be optimized and a thinner layer can be implemented at the bottom of the fin due to higher relaxation after at the bottom of the fin as compared to the top of the fin.

In certain embodiments, the multiple concentrations of germanium can be introduced to create stress that is more uniform or substantially constant from a bottom of the fin interfacing with substrate 104 to a top of the fin than without the multiple concentrations.

In certain embodiments, the multiple concentrations of germanium can be introduced to obtain constant hole mobility within a channel of the fin, wherein the hole mobility is based on stress and germanium content of the fin.

In certain embodiments, germanium concentrations can be optimized to confine the holes or carriers in a certain portion of the fin without a homogeneous stress in the channel.

Figure 2:
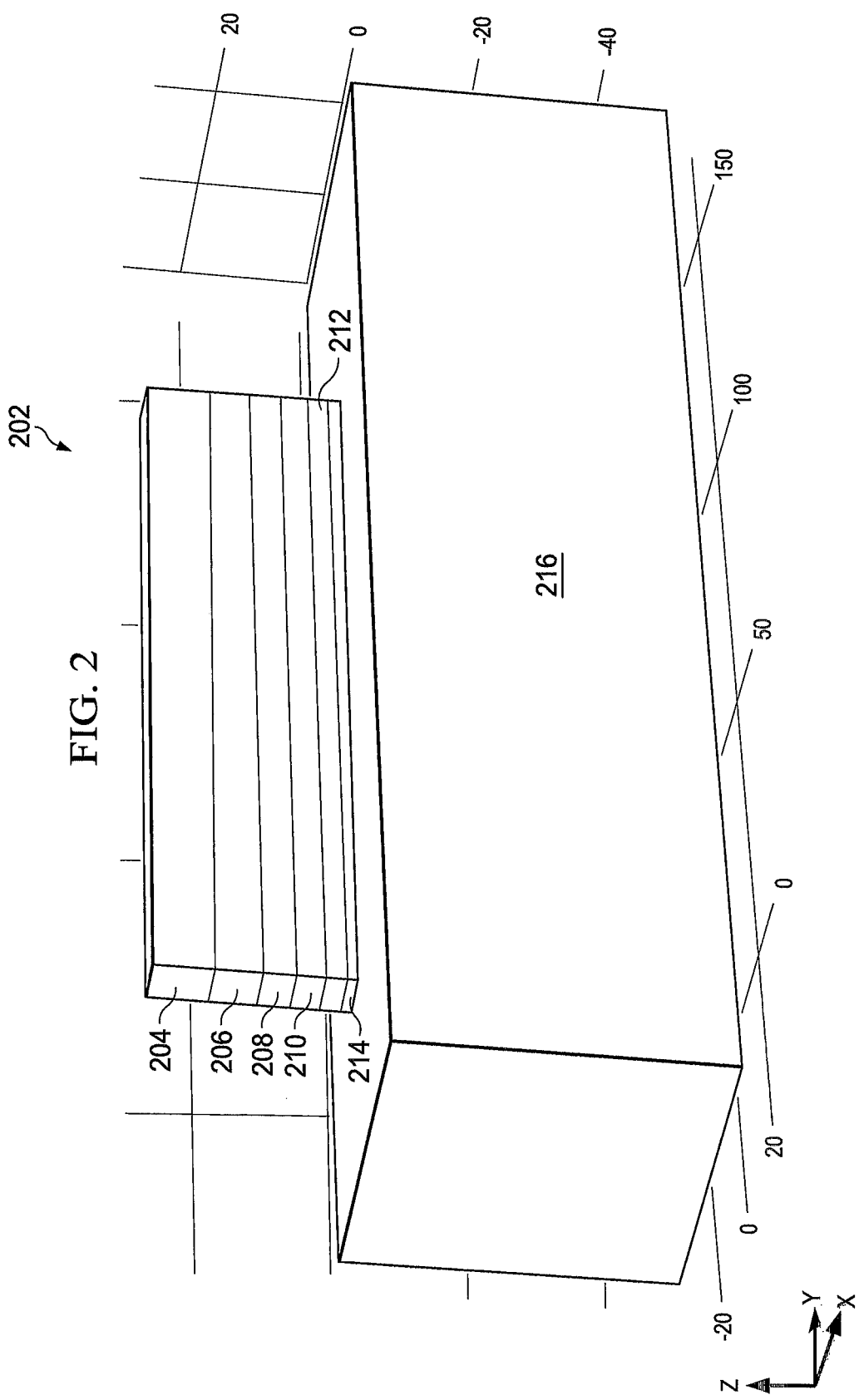
FIG. 2 illustrates a source and drain of a fin according to embodiments of the present disclosure.

FIG. 2 illustrates a source and drain of a fin according to embodiments of the present disclosure. The embodiment of fin 202 illustrated in FIG. 2 is for illustration only. Other embodiments of fin 202 could be used without departing from the scope of this disclosure.

Fin 202 may be an embodiment of fin 120 of FIG. 1. Fin 202 can be relatively short and can be a very long fin. Fin 202 comprises multiple layers 204-214 and is constructed on to of substrate 216. Table 1 below indicates the layer number, germanium percentage, thickness, and stress for each of the layers 204-214. A number of layers as well as each layer's germanium percentage and thickness can be selected to determine an amount of stress in that layer.

TABLE 1

| Layer | Ge Percentage (%) | Thickness (nm) | Stress (Gpa) |
|---|---|---|---|
| 6 (top, 204) | 39 | 9 | −2.55 |
| 5 (206) | 37 | 7 | −2.4 |
| 4 (208) | 34 | 5 | −2.2 |
| 3 (210) | 30 | 4 | −2 |
| 2 (212) | 27 | 3 | −1.8 |
| 1 (bottom, 214) | 20 | 2 | −1.4 |

Layer 204 is a sixth layer of SiGe on fifth layer 206 on a top of fin 202. Layer 204 comprises 39% germanium and a 9 nm thickness, which yields −2.55 Gpa of stress. Layer 214 is a first layer SiGe on top of substrate 216 and below second layer 212. Layer 214 comprises 20% germanium and a 2 nm thickness, which yields −1.4 Gpa of stress. Layers 206-212 are between top layer 204 and bottom layer 214 with different germanium concentrations and layer thicknesses. As indicated in table 1, germanium percentage may increase and thickness may increase going from bottom layer 214 to top layer 204.

In certain embodiments, changes in germanium percentage and thickness between layers may increase or decrease independently to select an amount of stress induced into one or more layers. Additionally, germanium percentage within a layer may increase or decrease to further select an amount stress induced into one or more layers.

Figure 3:
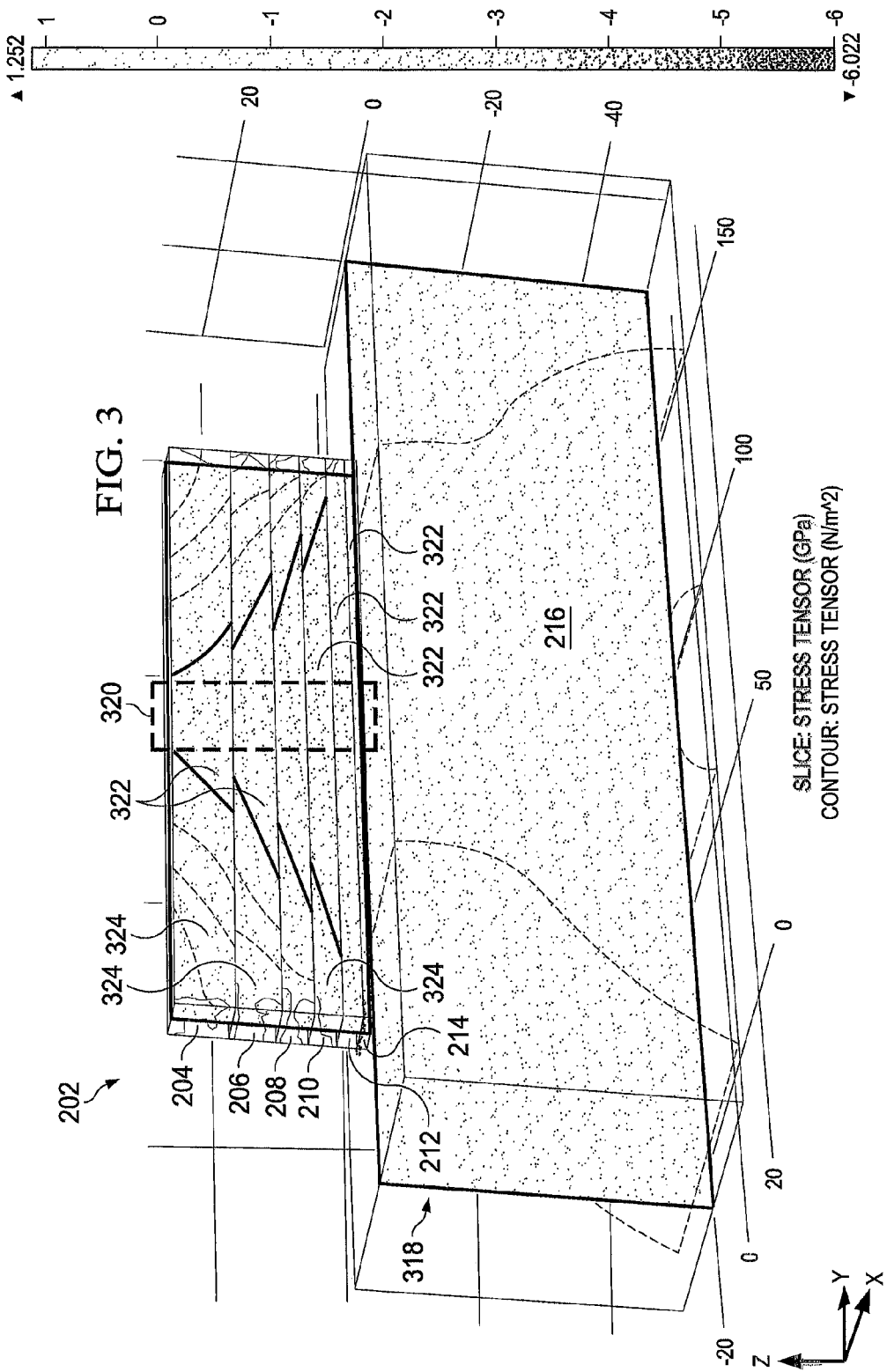
FIG. 3 illustrates a stress profile of a fin according to embodiments of the present disclosure.

FIG. 3 illustrates a stress profile of a fin according to embodiments of the present disclosure. The embodiment of fin 202 illustrated in FIG. 3 is for illustration only. Other embodiments of fin 202 could be used without departing from the scope of this disclosure.

Stress profile 318 is along a central longitudinal plane of fin 202. Channel 320 is located within inner portions 322 of layers 204-214. Stress at inner portions 322 of layers 204-214 are relatively constant as compared to stress at outer portions 324 of layers 204-214. Stress within channel 320 is substantially constant throughout the height of fin 202 from first bottom layer 214 to sixth top layer 204.

Figure 4:
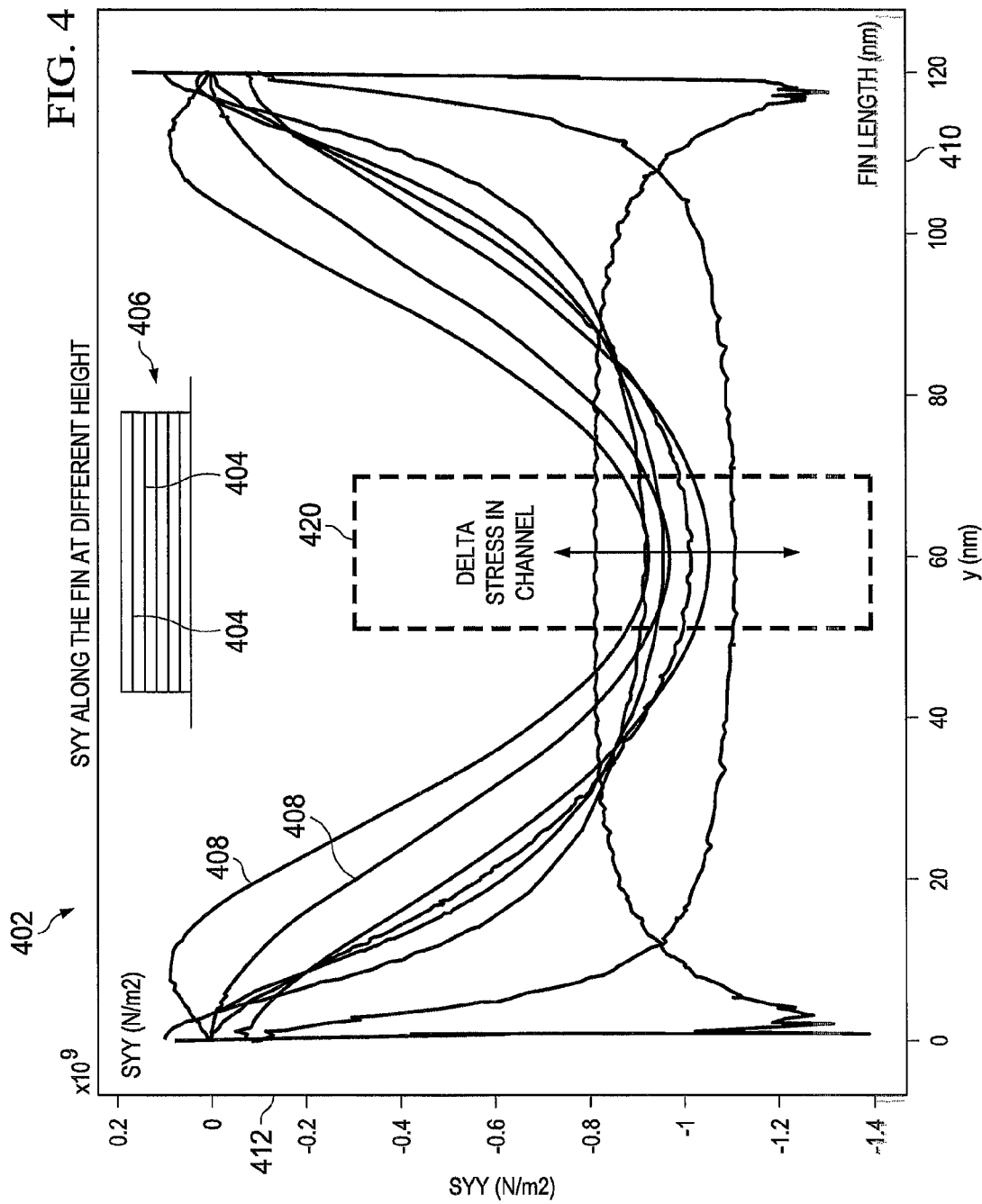
FIG. 4 illustrates a graph of stress induced at multiple lines within a fin according to embodiments of the present disclosure.

FIG. 4 illustrates a graph of stress induced along multiple lines within a fin according to embodiments of the present disclosure. The embodiment illustrated in FIG. 4 is for illustration only. Other embodiments could be used without departing from the scope of this disclosure. Graph 402 includes graph 406, plot lines 408, x axis 410, and y axis 412.

Graph 406 is a representation of a fin with multiple layers and concentrations of SiGe, for which plot lines 408 are plotted. Graph 406 includes lines 404 that are parallel to a longitudinal axis of the fin of graph 406. Each of lines 404 correspond to one of plot lines 408. X axis 410 corresponds to a length of a fin in nanometers (nm). Y axis 412 corresponds to an amount of stress at various points in a layer of a fin and is measured in $10^9$ Newtons per meter squared ($10^9$ N/m$^2$). Graph 402 illustrates that stress in channel 420 in a center of a fin can be substantially constant. As shown in the embodiment of FIG. 4, stress within channel 420 remains between −0.8 and −1.2×$10^9$ N/m$^2$ while stress outside of channel 420 is between 0.2 and −1.4×$10^9$ N/m$^2$.

Figure 5:
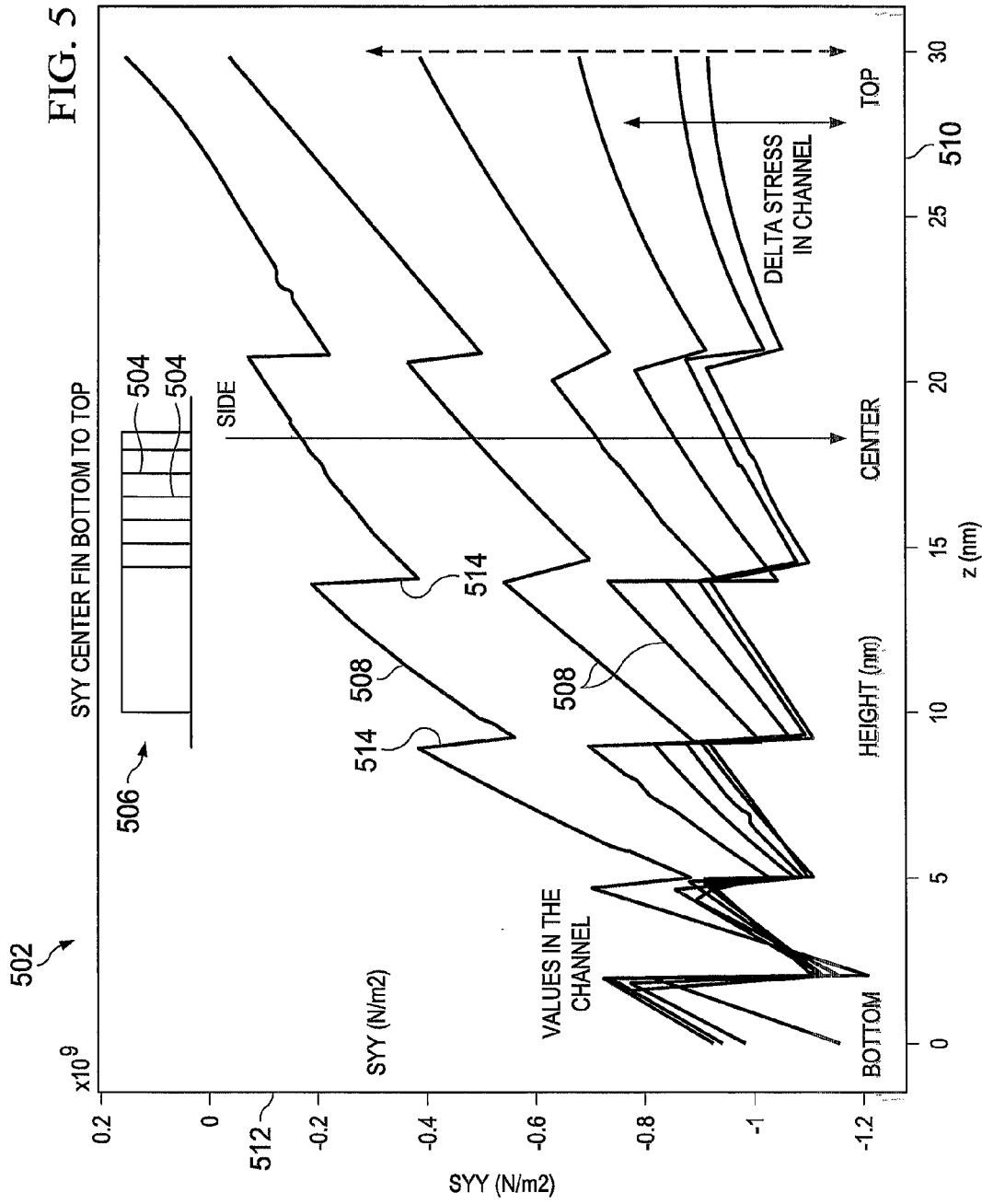
FIG. 5 illustrates a graph of stress induced at multiple lines within a fin according to embodiments of the present disclosure.

FIG. 5 illustrates a graph of stress induced along multiple lines within a fin according to embodiments of the present disclosure. The embodiment illustrated in FIG. 5 is for illustration only. Other embodiments could be used without departing from the scope of this disclosure. Graph 502 includes graph 506, plot lines 508, x axis 510, and y axis 512.

Graph 506 is a representation of a fin for which plot lines 508 are plotted. Graph 506 includes lines 504 that are perpendicular to a longitudinal axis of the fin of graph 506. Each of lines 504 correspond to one of plot lines 508. X axis 510 corresponds to a height of a fin in nanometers (nm). Y axis 512 corresponds to an amount of stress at various points within a fin and is measured in Newtons per meter squared ($10^9$ N/m$^2$). Graph 506 illustrates that stress in a channel center of a fin can be substantially constant. As shown in the embodiment of FIG. 5, stress along lines 504 that are closest to a center of the fin of graph 506 remains below $-0.6 \times 10^9$ N/m$^2$ while stress along lines 504 outside of the center of the fin of graph 506 varies between 0.2 and $-1.2 \times 10^9$ N/m$^2$. The jagged portions 514 within plot lines 508 occur at interfaces between layers of a SiGe stack of a fin, e.g., between third layer 210 and fourth layer 208 of fin 202 of FIG. 2.

Figure 6:
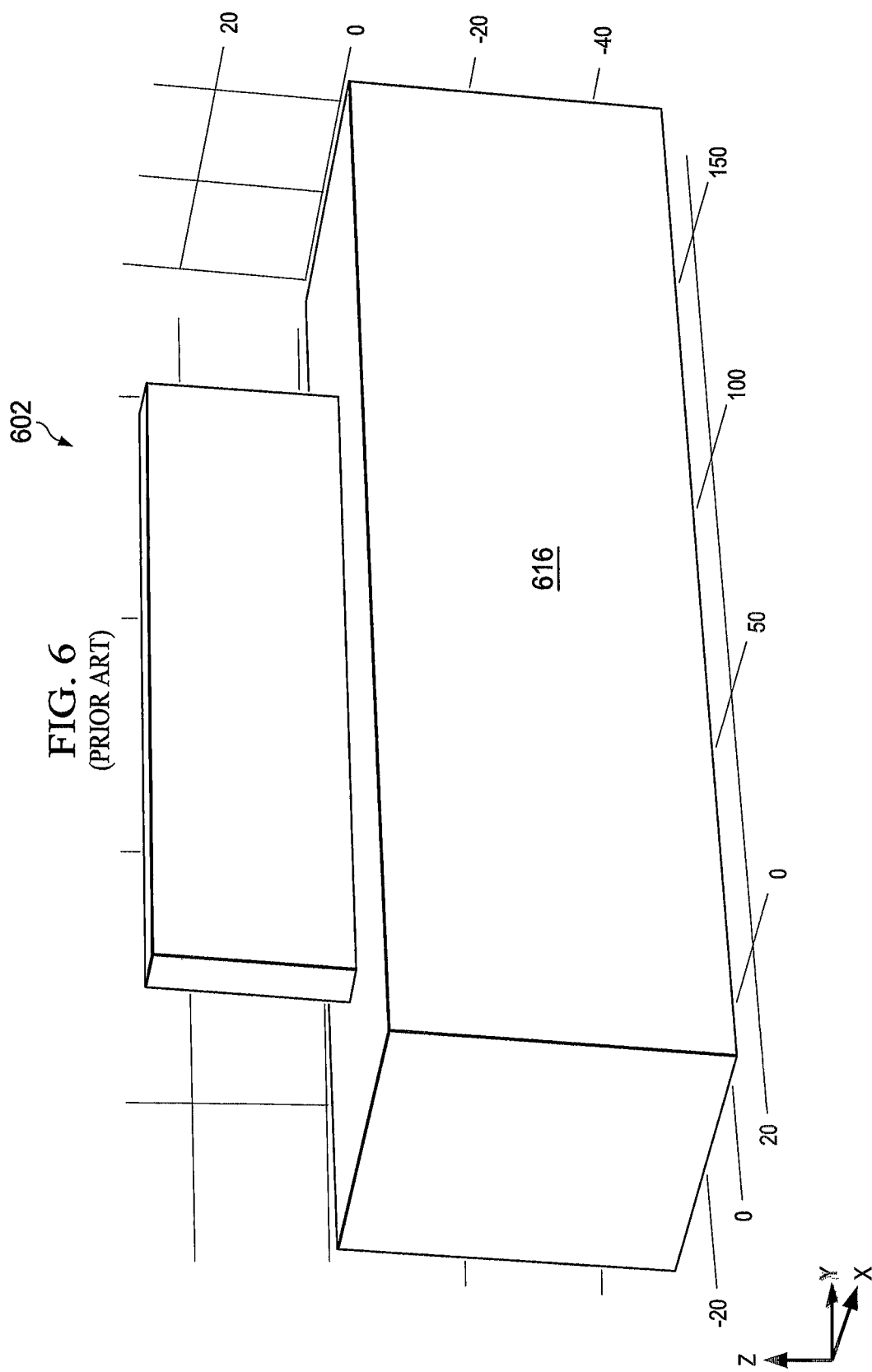
FIG. 6 illustrates a source and drain of a fin of the prior art.

FIG. 6 illustrates a source and drain of a fin having a single concentration percentage of SiGe of the prior art. Fin 602 is constructed upon substrate 616. Fin 602 comprises a homogeneous concentration of germanium as compared to silicon.

Figure 7:
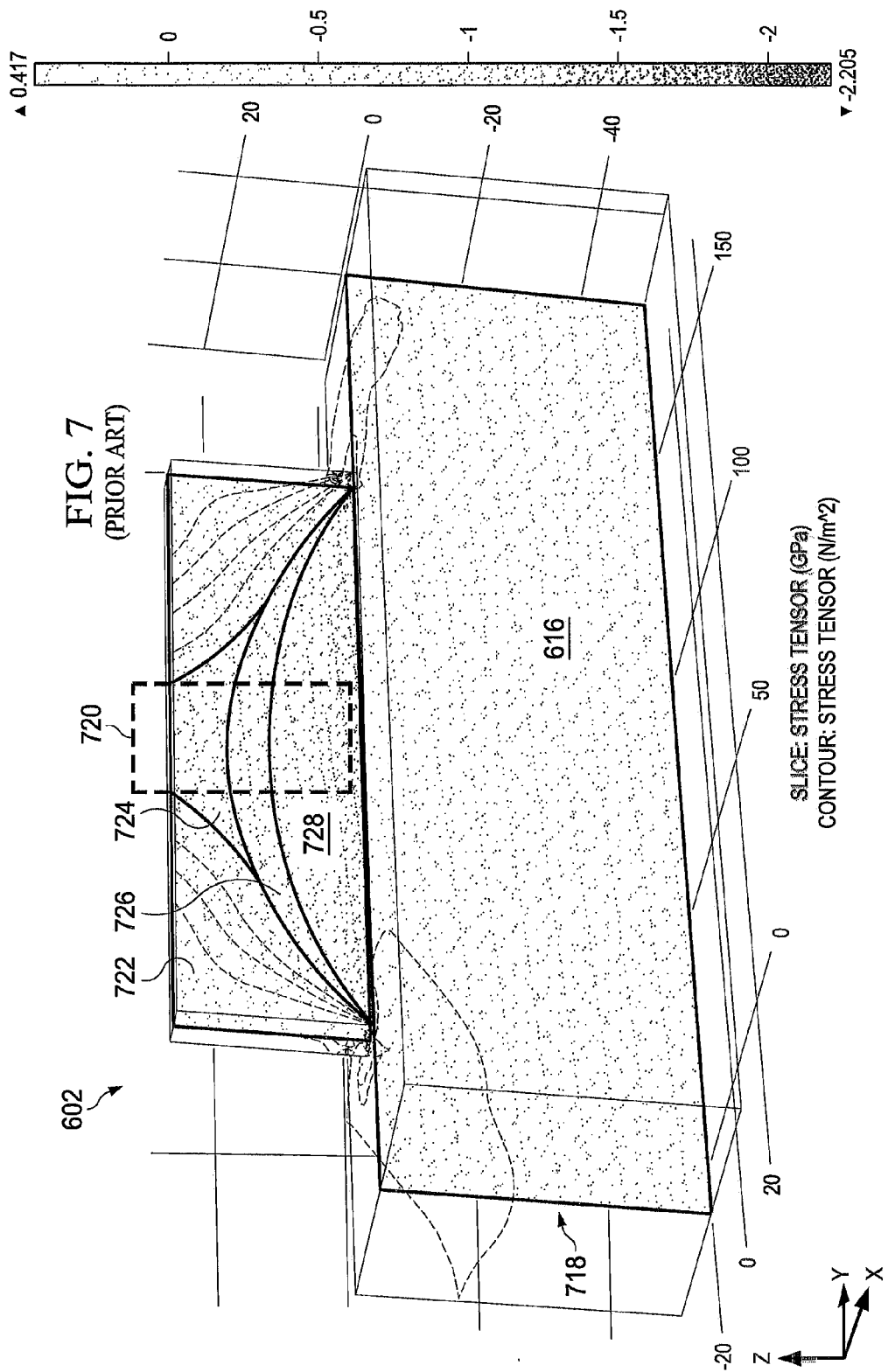
FIG. 7 illustrates a stress profile of a fin having a single concentration percentage of SiGe of the prior art.

FIG. 7 illustrates a stress profile of a fin having a single concentration percentage of SiGe of the prior art. Stress profile 718 is along a central longitudinal plane of fan 602. Channel 720 is located within a portion of fin 602. Portions 724-728 of fin 602 comprise different amounts of induced stress. Stress within channel 720 is not substantially constant.

Figure 8:
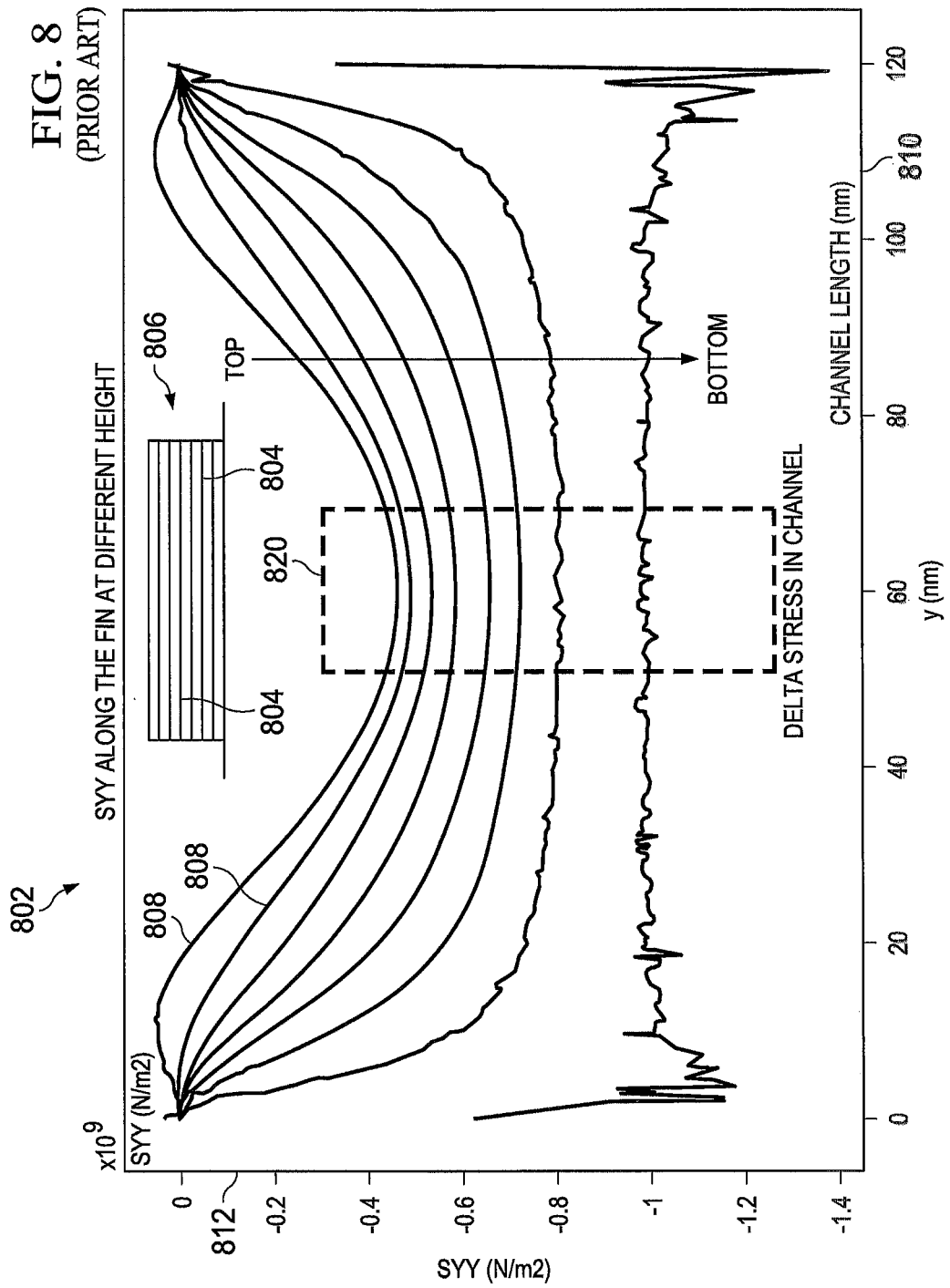
FIG. 8 illustrates a graph of stress induced along multiple lines within a fin having a single concentration percentage of SiGe of the prior art.

FIG. 8 illustrates a graph of stress induced along multiple lines within a fin having a single concentration percentage of SiGe of the prior art. Graph 802 includes graph 806, plot lines 808, x axis 810, and y axis 812.

Graph 806 is a representation of a fin with a single concentration percentage of SiGe, for which plot lines 808 are plotted. Graph 806 includes lines 804 that are parallel to a longitudinal axis of the fin of graph 806. Each of lines 804 correspond to one of plot lines 808. X axis 810 corresponds to a length of a fin in nanometers (nm). Y axis 812 corresponds to an amount of stress at various points within a fin and is measured in Newtons per meter squared ($10^9$ N/m$^2$). Graph 802 illustrates that stress in channel 820 in a center of a fin varies substantially. As shown in the embodiment of FIG. 8, stress within channel 820 fluctuates between $-0.4$ and $-1.0 \times 10^9$ N/m$^2$.

Figure 9:
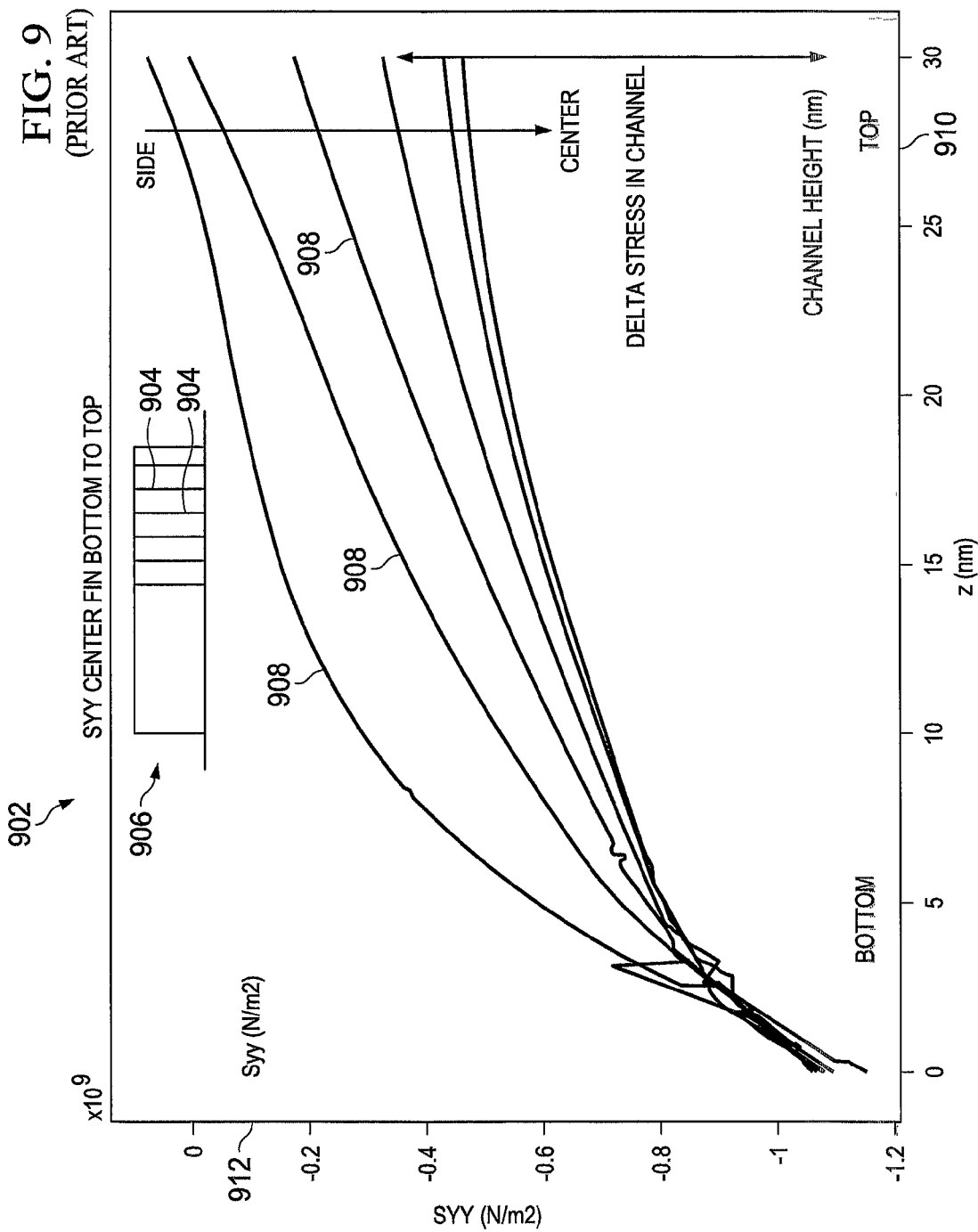
FIG. 9 illustrates a graph of stress induced along multiple lines within a fin having a single concentration percentage of SiGe of the prior art.

FIG. 9 illustrates a graph of stress induced along multiple lines within a fin having a single concentration percentage of SiGe of the prior art. Graph 906 is a representation of a fin for which plot lines 908 are plotted. Graph 906 includes lines 904 that are perpendicular to a longitudinal axis of the fin of graph 906. Each of lines 904 correspond to one of plot lines 908. X axis 910 corresponds to a height of a fin in nanometers (nm). Y axis 912 corresponds to an amount of stress at various points within a fin and is measured in Newtons per meter squared ($10^9$ N/m$^2$). Graph 906 illustrates that stress in a channel center of a fin with a homogeneous concentration percentage of SiGe is not substantially constant. As shown in the embodiment of FIG. 9, stress along lines 904 that are closest to a center of the fin of graph 906 goes above $-0.6 \times 10^9$ N/m$^2$.

Figure 10:
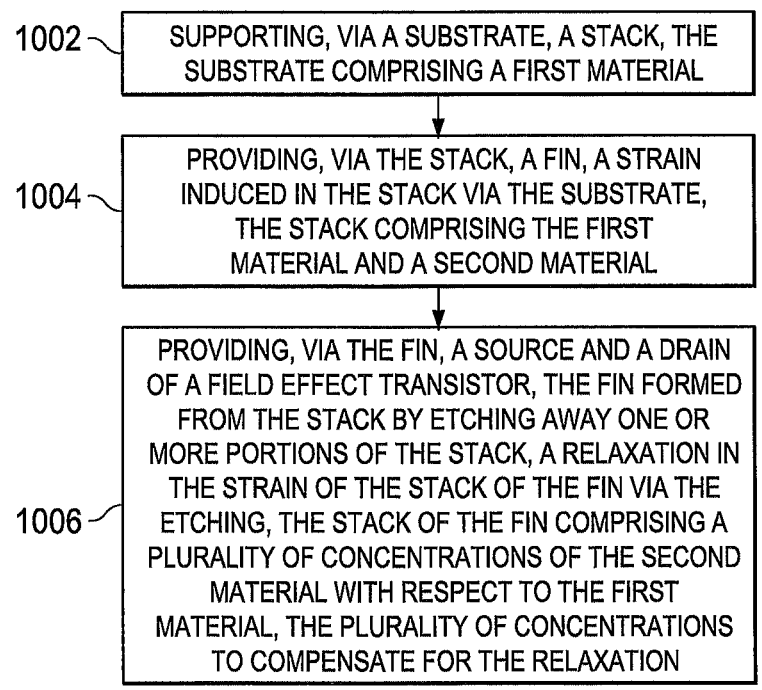
FIG. 10 is a flow diagram illustrating providing multiple concentrations of SiGe in a FinFET according to embodiments of the present disclosure.

FIG. 10 is a flow diagram illustrating providing multiple concentrations of SiGe in a FinFET according to embodiments of the present disclosure. While the flowchart depicts a series of sequential steps, unless explicitly stated, no inference should be drawn from that sequence regarding specific order of performance of steps, or portions thereof, serially rather than concurrently or in an overlapping manner, or performance the steps depicted exclusively without the occurrence of intervening or intermediate steps. The process depicted in the example is implemented by a FET, for example, a FinFET. Fin 202 of FIG. 2 can implement one or more steps depicted in the flow diagram of FIG. 10.

At 1002, a substrate supports a stack, wherein the substrate comprises a first material. The first material is a semiconductor, such as silicon.

At 1004, the stack provides a fin. A strain is induced in the stack via the substrate. The stack comprises the first material and a second material. The second material can comprise any number of periodic elements, including one or more of: germanium and tin.

At 1006, the fin provides a source and a drain of a field effect transistor. The fin is formed from the stack by etching away one or more portions of the stack. A relaxation occurs in the strain of the stack of the fin via the etching. The stack of the fin comprises a plurality of concentrations of the second material with respect to the first material. The plurality of concentrations compensates for the relaxation. The plurality of concentrations provides a substantially constant strain in a channel of the stack of the fin. The first portion of the fin is proximate to the substrate and the second portion of the fin distal to the substrate. The stack is formed above the substrate. The plurality of concentrations is arranged substantially perpendicular to the substrate. Each concentration of the plurality of concentrations corresponds to a layer of a plurality of layers of the stack. Each layer has a thickness and the thicknesses of the layers may vary via one or more of a linear function, an exponential function, and a polynomial function.

In certain embodiments, the plurality of concentrations is formed as a smooth gradient from a first portion of the fin to a second portion of the fin. In certain embodiments, one or more layers of the plurality of layers can have a second plurality of concentrations arranged substantially parallel to the substrate.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus of a semiconductor, the apparatus comprising:
   a substrate supporting a stack,
   the substrate comprising a first material;
   the stack providing a fin, the stack comprising:
   a strain induced in the stack via the substrate;
   the first material and a second material; and
   a plurality of concentrations, in the fin, of the second material with respect to the first material,
   the fin providing a source and a drain of a field effect transistor.

2. An apparatus of a semiconductor, the apparatus comprising:
   a substrate supporting a stack;
   the substrate comprising a first material;
   the stack providing a fin, the stack comprising:
   a strain induced in the stack via the substrate;
   the first material and a second material; and
   the second material including a plurality of concentrations with respect to the first material;
   the fin providing a source and a drain of a field effect transistor;

wherein the fin is formed from the stack by etching away one or more portions of the stack;
wherein a relaxation in the strain of the stack of the fin occurs via the etching; and
wherein the plurality of concentrations compensate for the relaxation.

3. The apparatus of claim 1,
wherein the first material is silicon and the second material comprises one or more of germanium and tin.

4. The apparatus of claim 1,
wherein the plurality of concentrations provide a substantially constant strain in a channel of the stack of the fin.

5. The apparatus of claim 2
wherein the plurality of concentrations is formed as a smooth gradient from a first portion of the fin to a second portion of the fin; and
wherein the first portion of the fin is proximate to the substrate and the second portion of the fin is distal to the substrate.

6. The apparatus of claim 2
wherein the stack is formed above the substrate; and
wherein the plurality of concentrations is arranged substantially perpendicular to the substrate.

7. The apparatus of claim 6,
wherein each concentration of the plurality of concentrations corresponds to a layer of the stack;
wherein each layer has a thickness; and
wherein one or more layers has a second plurality of concentrations arranged substantially parallel to the substrate.

8. A method of a semiconductor apparatus, the method comprising:
supporting, via a substrate, a stack,
the substrate comprising a first material;
providing, via the stack, a fin,
a strain induced in the stack via the substrate, and
the stack comprising the first material and a second material; and
providing, via the fin, a source and a drain of a field effect transistor,
the fin formed from the stack by etching away one or more portions of the stack,
a relaxation in the strain of the stack of the fin via the etching,
the stack of the fin comprising a plurality of concentrations of the second material with respect to the first material, and
the plurality of concentrations to compensate for the relaxation.

9. The method of claim 8,
wherein the first material is silicon and the second material comprises one or more of germanium and tin.

10. The method of claim 8,
wherein one or more of the first material and the second material is a semiconducting material.

11. The method of claim 8,
wherein the plurality of concentrations provides a substantially constant strain in a channel of the stack of the fin.

12. The method of claim 8,
wherein the plurality of concentrations is formed as a smooth gradient from a first portion of the fin to a second portion of the fin; and
wherein the first portion of the fin proximate to the substrate and the second portion of the fin distal to the substrate.

13. The method of claim 8,
wherein the stack is formed above the substrate; and
wherein the plurality of concentrations arranged substantially perpendicular to the substrate.

14. The method of claim 13,
wherein each concentration of the plurality of concentrations corresponding to a layer of a plurality of layers of the stack;
wherein each layer has a thickness; and
wherein one or more layers of the plurality of layers has a second plurality of concentrations arranged substantially parallel to the substrate.

15. A fin field effect transistor (FinFET) structure comprising:
a substrate made of a first material; and
a fin formed overlying the substrate,
the fin including a second material
having a non-uniform concentration, from a top layer the fin to a bottom layer of the fin, of the second material with respect to the first material; and
the fin providing a channel of the FinFET.

16. A fin field effect transistor (FinFET) structure comprising:
a substrate made of a first material; and
a fin formed the substrate including a second material a non-uniform concentration, from a top layer of the fin to a bottom layer of the fin, of the second material with respect to the first material, the fin providing a channel of a FinFET,
wherein the fin is formed from a stack by etching away one or more portions of the stack;
wherein a relaxation in a strain of the stack of the fin is created via the etching; and
wherein the non-uniform concentration compensates for the relaxation.

17. The FinFET structure of claim 15,
wherein the first material is silicon and the second material comprises one or more of germanium and tin.

18. The FinFET structure of claim 16,
wherein the non-uniform concentration provides a substantially constant strain in the channel of the finFET.

19. The FinFET structure of claim 16,
wherein the non-uniform concentration is formed as a smooth gradient from the bottom layer of the fin to the top layer of the fin; and
wherein the bottom layer of the fin is proximate to the substrate and the top layer of the fin is distal to the substrate.

20. The FinFET structure of claim 16,
wherein the non-uniform concentration of the second material is arranged substantially perpendicular to the substrate.

21. The FinFET structure of claim 16,
wherein the non-uniform concentration corresponds to a layer of a plurality of layers of the stack;
wherein each layer has a thickness; and
wherein one or more layers of the plurality of layers has a second non-uniform concentration arranged substantially parallel to the substrate.

* * * * *

UNITED STATES PATENT AND TRADEMARK OFFICE
CERTIFICATE OF CORRECTION

PATENT NO. : 9,000,498 B2  
APPLICATION NO. : 13/931581  
DATED : April 7, 2015  
INVENTOR(S) : Morin It is certified that error appears in the above-identified patent and that said Letters Patent is hereby corrected as shown below:

Column 8, Lines 28-29, Claim 16:
"a fin formed the substrate including a second material a non-uniform concentration, from a top layer of the fin to" should read, --a fin formed overlying the substrate, the fin including a second material having a non-uniform concentration, from a top layer of the fin to--.

Column 8, Line 39, Claim 17:
"The FinFET structure of claim 15," should read, --The FinFET structure of claim 16,--.

Column 8, Lines 57-58, Claim 21:
"wherein the non-uniform concentration corresponds to a layer of a plurality of layers of the stack;" should read, --wherein the non-uniform concentration corresponds to a plurality of layers of the stack;--.

Signed and Sealed this  
Twenty-fourth Day of May, 2016

Michelle K. Lee  
*Director of the United States Patent and Trademark Office*